US010459659B2

(12) United States Patent
Swaminathan et al.

(10) Patent No.: US 10,459,659 B2
(45) Date of Patent: Oct. 29, 2019

(54) TECHNOLOGIES FOR ISSUING COMMANDS ON SELECTED MEMORY DEVICES

(71) Applicant: Intel Corporation, Santa Clara, CA (US)

(72) Inventors: Muthukumar P. Swaminathan, Folsom, CA (US); Kunal A. Khochare, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 45 days.

(21) Appl. No.: 15/475,341

(22) Filed: Mar. 31, 2017

(65) Prior Publication Data
US 2018/0285020 A1 Oct. 4, 2018

(51) Int. Cl.
G06F 3/06 (2006.01)
G06F 13/16 (2006.01)
G11C 8/12 (2006.01)
G11C 16/08 (2006.01)
G11C 16/20 (2006.01)

(52) U.S. Cl.
CPC .......... *G06F 3/0659* (2013.01); *G06F 3/0604* (2013.01); *G06F 3/0656* (2013.01); *G06F 3/0688* (2013.01); *G06F 13/1668* (2013.01); *G11C 8/12* (2013.01); *G11C 16/08* (2013.01); *G11C 16/20* (2013.01)

(58) Field of Classification Search
USPC ........................................................ 711/102
See application file for complete search history.

(56) References Cited

U.S. PATENT DOCUMENTS

| 7,881,321 B2* | 2/2011 | Deneroff | G06F 15/17381 370/412 |
| 8,006,057 B2* | 8/2011 | LaBerge | G06F 13/4022 711/167 |
| 8,264,903 B1* | 9/2012 | Lee | G11C 11/40611 365/194 |
| 8,930,647 B1* | 1/2015 | Smith | G06F 9/44557 711/103 |

(Continued)

FOREIGN PATENT DOCUMENTS

WO 2008/021909 2/2008
WO 2017/052853 3/2017

OTHER PUBLICATIONS

Extended European Search Report in European Patent Application No. 18155639.0, dated Jul. 26, 2018 (8 pages).

(Continued)

*Primary Examiner* — Mano Padmanabhan
*Assistant Examiner* — Jean C Edouard
(74) *Attorney, Agent, or Firm* — Barnes & Thornburg LLP

(57) ABSTRACT

Technologies for issuing commands on selected memory devices includes an apparatus that includes a data storage controller and multiple non-volatile, write in place, byte or block addressable memory devices. The memory devices are arranged in one or more ranks, and the memory devices in each rank are connected to a same communication channel. The data storage controller is to select a subgroup of the plurality of the memory devices in a rank without modifying an identifier of each memory device, and issue a command to operate on data of the selected subgroup.

25 Claims, 6 Drawing Sheets

(56) References Cited

U.S. PATENT DOCUMENTS

| | | | | |
|---|---|---|---|---|
| 2006/0041730 A1* | 2/2006 | Larson | G06F | 13/4243 |
| | | | | 711/167 |
| 2009/0177849 A1* | 7/2009 | Mazzola | G06F | 13/1684 |
| | | | | 711/154 |
| 2009/0177853 A1* | 7/2009 | Mazzola | G06F | 12/0292 |
| | | | | 711/158 |
| 2009/0177861 A1* | 7/2009 | Mazzola | G06F | 13/4243 |
| | | | | 711/202 |
| 2010/0138598 A1* | 6/2010 | LaBerge | G06F | 13/4022 |
| | | | | 711/105 |
| 2010/0217915 A1* | 8/2010 | O'Connor | G06F | 11/1004 |
| | | | | 711/5 |
| 2013/0036273 A1* | 2/2013 | Shaeffer | G06F | 13/16 |
| | | | | 711/148 |
| 2013/0117495 A1* | 5/2013 | Rajan | G06F | 12/00 |
| | | | | 711/102 |
| 2014/0281133 A1* | 9/2014 | Karamcheti | G06F | 3/061 |
| | | | | 711/103 |
| 2014/0281207 A1* | 9/2014 | Mandava | G11C | 14/0009 |
| | | | | 711/106 |
| 2015/0023118 A1* | 1/2015 | Shaeffer | G06F | 13/1694 |
| | | | | 365/193 |
| 2015/0106560 A1* | 4/2015 | Perego | G06F | 12/10 |
| | | | | 711/105 |
| 2015/0270000 A1* | 9/2015 | Perego | G06F | 12/10 |
| | | | | 711/103 |
| 2016/0041761 A1 | 2/2016 | Moran | | |
| 2016/0118088 A1 | 4/2016 | Lee et al. | | |
| 2016/0132241 A1* | 5/2016 | Perego | G06F | 12/10 |
| | | | | 711/103 |
| 2017/0093400 A1* | 3/2017 | Bains | G06F | 3/061 |

OTHER PUBLICATIONS

European Office action in European Patent Application No. 18155639.0, dated Jul. 24, 2019 (6 pages).

* cited by examiner

TECHNOLOGIES FOR ISSUING COMMANDS ON SELECTED MEMORY DEVICES

BACKGROUND

Some data storage devices include a plurality of non-volatile memory devices that are arranged in one or more arrays. The non-volatile memory devices in a given array are connected to the same communication channel that receives a command to operate on data of the memory devices in the array. To selectively choose a subgroup of the memory devices on the same communication channel typically requires modifying an identifier of each memory device to be in the subgroup, and then selecting the memory devices with the modified identifier.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
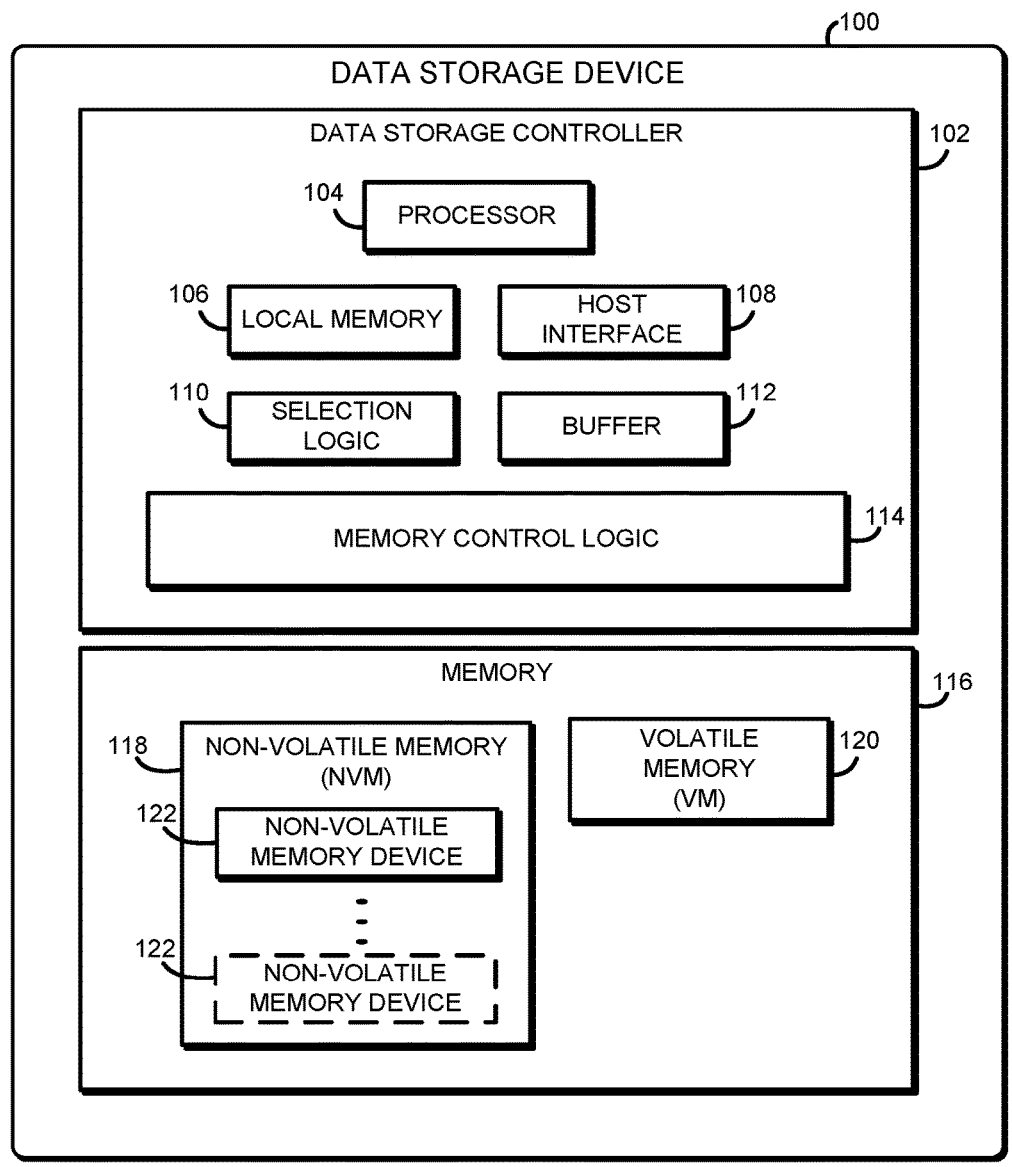
FIG. 1 is a simplified block diagram of at least one embodiment of a data storage device for performing a command on a subgroup of selected memory devices.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

As shown in FIG. 1, an illustrative data storage device 100 for performing a command on selected memory devices includes a data storage controller 102 and a memory 116, which illustratively includes non-volatile memory 118 and volatile memory 120. As discussed in more detail below, in use, the data storage controller 102 is configured to select a subgroup of one or more non-volatile memory devices for performing a data operation (e.g., read, write, refresh, etc.).

The data storage controller 102 of the data storage device 100 may be embodied as any type of control device, circuitry, or collection of hardware devices capable of writing, reading, locating, and replacing data in the non-volatile memory 118. In the illustrative embodiment, the data storage controller 102 includes a processor or processing circuitry 104, local memory 106, a host interface 108, selection logic 110, a buffer 112, and memory control logic 114. It should be appreciated that the data storage controller 102 may include additional devices, circuits, and/or components commonly found in a drive controller of a solid state drive in other embodiments.

The processor 104 may be embodied as any type of processor capable of performing the functions described herein. For example, the processor 104 may be embodied as a single or multi-core processor(s), digital signal processor, field programmable gate arrays (FPGA), microcontroller, or other processor or processing/controlling circuit. Similarly, the local memory 106 may be embodied as any type of volatile and/or non-volatile memory or data storage capable of performing the functions described herein. In the illustrative embodiment, the local memory 106 stores firmware and/or other instructions executable by the processor 104 to perform the described functions of the data storage controller 102. In some embodiments, the processor 104 and the local memory 106 may form a portion of a system-on-a-chip (SoC) and be incorporated, along with other components of the data storage controller 102, onto a single integrated circuit chip.

The host interface 108 may also be embodied as any type of hardware processor, processing circuitry, input/output circuitry, and/or collection of components capable of facilitating communication of the data storage device 100 with a host device or service (e.g., a host application). That is, the host interface 108 embodies or establishes an interface for accessing data stored on the data storage device 100 (e.g., stored in the memory 116). To do so, the host interface 108 may be configured to utilize any suitable communication protocol and/or technology to facilitate communications with the data storage device 100 depending on the type of data storage device. For example, the host interface 108 may be configured to communicate with a host device or service using Serial Advanced Technology Attachment (SATA), Peripheral Component Interconnect express (PCIe), Serial Attached SCSI (SAS), Universal Serial Bus (USB), and/or other communication protocol and/or technology in some embodiments.

In the illustrative embodiment, the selection logic 110 is embodied as dedicated circuitry and/or device configured to select one or more non-volatile memory devices of the non-volatile memory 118 of the memory 116 to form a subgroup to perform a command. The selection logic 110 may be embodied as a co-processor, an application specific integrated circuit (ASIC), or other dedicated circuitry or device. In such embodiments, the selection logic 110 provides a hardware accelerated implementation of the select-related operations described herein. In other embodiments, at least a portion of the selection logic 110 may be embodied as firmware or other processor-executable instructions.

The buffer 112 of the data storage controller 102 is embodied as volatile memory used by the data storage controller 102 to temporarily store data that is being read from or written to the memory 116. The particular size of the buffer 112 may be dependent on the total storage size of the memory 116. The memory control logic 114 is illustratively embodied as hardware circuitry and/or one or more devices configured to control the read/write access to data at particular storage locations of memory 116.

The non-volatile memory 118 may be embodied as any type of data storage capable of storing data in a persistent manner (even if power is interrupted to non-volatile memory 118). For example, in the illustrative embodiment, the non-volatile memory 118 is embodied as one or more non-volatile memory devices 122. The non-volatile memory devices 122 are illustratively embodied as byte or block-addressable, write-in-place non-volatile memory devices. In the illustrative embodiment, the non-volatile memory devices 122 are arranged in ranks. It should be appreciated that the non-volatile memory devices 122 in each rank are connected to the same communication channel as discussed in more detail below. However, in other embodiments, the non-volatile memory 118 may be embodied as any combination of memory devices that use chalcogenide phase change material (e.g., chalcogenide glass), or other types of byte or block-addressable, write-in-place non-volatile memory, ferroelectric random-access memory (FeTRAM), nanowire-based non-volatile memory, phase change memory (PCM), memory that incorporates memristor technology, magnetoresistive random-access memory (MRAM) or spin transfer torque (STT)-MRAM.

The volatile memory 120 may be embodied as any type of data storage capable of storing data while power is supplied to the volatile memory 120. For example, in the illustrative embodiment, the volatile memory 120 is embodied as one or more volatile memory devices, and is periodically referred to hereinafter as volatile memory 120 with the understanding that the volatile memory 120 may be embodied as other types of non-persistent data storage in other embodiments. The volatile memory devices of the volatile memory 120 are illustratively embodied as dynamic random-access memory (DRAM) devices, but may be embodied as other types of volatile memory devices and/or memory technologies capable of storing data while power is supplied to volatile memory 120.

Figure 2:
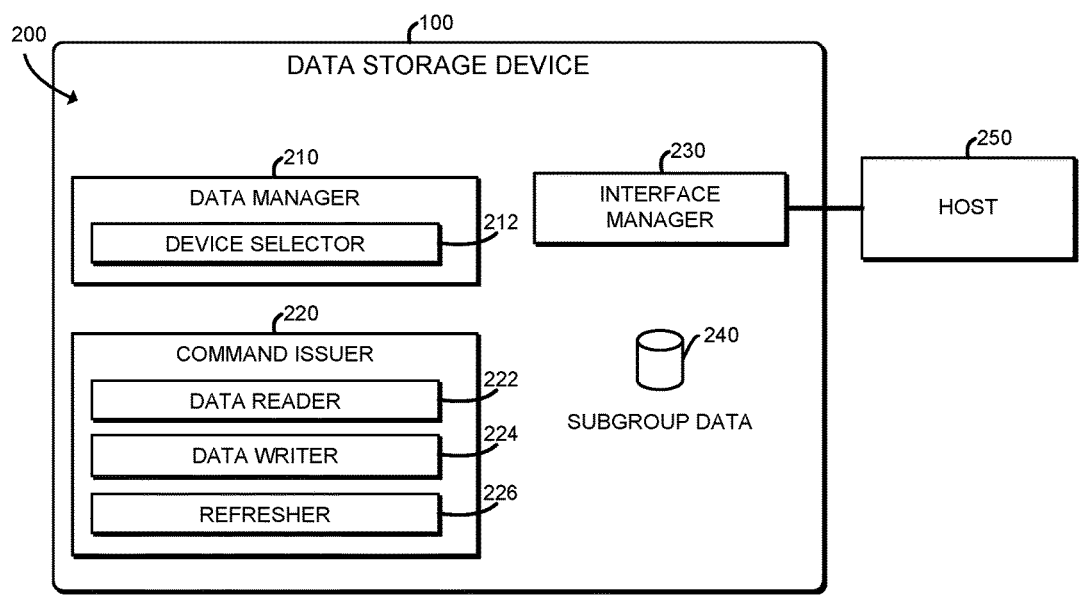
FIG. 2 is a simplified block diagram of at least one embodiment of an environment that may be established by the data storage controller of FIG. 1.

Referring now to FIG. 2, in use, the data storage device 100 may establish an environment 200. The illustrative environment 200 includes a data manager 210, a command issuer 220, and an interface manager 230. The data manager 210 further includes a device selector 212. Further, the command issuer 220 further includes a data reader 222, a data writer 224, and a refresher 226. Additionally, the illustrative environment 200 includes subgroup data 240, which may be embodied as any data indicative of one or more subgroups and the memory devices associated with (e.g., within) each subgroup. The subgroup data 240 may be accessed by the modules and/or sub-modules of the data storage controller 102. Each of the components of the environment 200 may be embodied as firmware, software, hardware, or a combination thereof. For example the logic and other components of the environment 200 may form a portion of, or otherwise be established by, the data storage controller 102 or other hardware components of the data storage device 100. As such, in some embodiments, any one or more of the components of the environment 200 may be embodied as a circuit or collection of electrical devices (e.g., a data manager circuit 210, a device selector circuit 212, a command issuer circuit 220, a data reader circuit 222, a data writer circuit 224, a refresher circuit 226, an interface manager circuit 230, etc.).

The data manager 210, which may be embodied as hardware, firmware, software, virtualized hardware, emulated architecture, and/or a combination thereof as discussed above, is configured to control which non-volatile memory devices 122 of the non-volatile memory 118 are selected to perform a command. To do so, the data manager 210 includes the device selector 212. The device selector 212 is configured to select a subgroup of non-volatile memory devices 122 to perform a command. Specifically, as described above, in the illustrative embodiment, the non-volatile memory 118 is embodied as a plurality of non-volatile memory devices 122 that are arranged in ranks. The non-volatile memory devices 122 in each rank are connected via a communication channel. Because the non-volatile memory devices 122 in a rank share the same communication channel, all non-volatile memory devices 122 in the same rank receive and perform in response to a command unless the device selector 212 defines a subgroup of non-volatile memory devices 122 in the rank to perform a command In the illustrative embodiment, the device selector 212 is configured to form a subgroup of non-volatile memory devices 122 by selecting (i.e., adding or removing) one or more non-volatile memory devices 122 within the same rank to perform a command (e.g., read or write). It should be appreciated that selectively adding or removing a non-volatile memory device 122 of the same rank to a subgroup to perform a command reduces the overhead in memory and energy usage that would otherwise be incurred if the all of the non-volatile memory devices 122 in the rank were to perform the command Present invention includes methods of selecting one or more non-volatile memory devices 122 in a rank without modifying the assigned identifier of each of the non-volatile memory device 122.

Device State

In some embodiments, the device selector 212 is configured to create a subgroup of one or more non-volatile memory devices 122 in a rank based on a device state of each non-volatile memory device 122. In such embodiments, each non-volatile memory device 122 includes a device state indicative of whether the non-volatile memory device 122 is selected or deselected to perform a command This allows the device selector 212 to select or deselect a non-volatile memory device 122 by changing the device state of the non-volatile memory device 122 without modifying a unique identifier of the non-volatile memory device 122. In such embodiments, only the subgroup of non-volatile memory devices 122 that are in selected state respond to a command For example, the device selector 212 may add a non-volatile memory device 122 to a subgroup by selecting the identifier of the non-volatile memory device 122. If the selected identifier matches a non-volatile memory device 122 within the rank, the device state of the non-volatile memory device 122 changes to the selected state. If the selected identifier does not match a non-volatile memory device 122 within the rank, the device state of the non-volatile memory device 122 does not change. For example, if the non-volatile memory device 122 was in a selected state, the device state will remain in the selected state, and if the non-volatile memory device 122 was in a deselected state, the device state will remain in the deselected state.

Similarly, the device selector 212 may remove a non-volatile memory device 122 from a subgroup by selecting the identifier of the non-volatile memory device 122. If the selected identifier matches a non-volatile memory device 122 within the rank, the device state of the non-volatile memory device 122 changes to the deselected state. If the selected identifier does not match a non-volatile memory device 122 within the rank, the device state of the non-volatile memory device 122 does not change. For example, if the non-volatile memory device 122 was in a selected state, the device state will remain in the selected state, and if the non-volatile memory device 122 was in a deselected state, the device state will remain in the deselected state.

Mode Register Mask Bit

In some embodiments, the device selector 212 is configured to create a subgroup of one or more non-volatile memory devices 122 in a rank based on one or more mode register bits of each non-volatile memory device 122. In such embodiments, each non-volatile memory device 122 includes at least two mode register mask bits including a read command mask bit and a write command mask bit. The mode register mask bits allows the device selector 212 to select one or more non-volatile memory devices 122 to perform a read and/or write command by clearing the corresponding mode register mask bit of the non-volatile memory devices 122. Additionally, the device selector 212 may set one or more mode register mask bits of the non-volatile memory devices 122 to remove the non-volatile memory devices 122 from the subgroup associated with the corresponding command For example, the device selector 212 may add a non-volatile memory device 122 to a subgroup to perform a read command by clearing the read command mask bit of the non-volatile memory device 122. In such embodiments, only the subgroup of non-volatile memory devices 122 that have the read command mask bit cleared respond to a read command It should be appreciated that a non-volatile memory device 122 with the read command mask bit set does not respond to a read command even if a selected identifier matches the identifier of the non-volatile memory device 122. Similarly, the device selector 212 may add a non-volatile memory device 122 to a subgroup to perform a write command by clearing the write command mask bit of the non-volatile memory device 122. In such embodiments, only the subgroup of non-volatile memory devices 122 that have the write command mask bit cleared respond to a write command. It should be appreciated that a non-volatile memory device 122 with the write command mask bit set does not respond to a write command even if a selected identifier matches the identifier of the non-volatile memory device 122. In such embodiments, the device selector 212 may remove a non-volatile memory device 122 from the subgroup by setting the read command mask bit of the non-volatile memory device 122. The non-volatile memory device 122 with the read command mask bit set does not respond to a read command, and the non-volatile memory device 122 with the write command mask bit set does not respond to a write command.

For example, in the illustrative embodiments, the non-volatile memory 118 includes eleven of the non-volatile memory devices 122 arranged in a rank. Each non-volatile memory device 122 includes at least two identifiers, a master identifier and an assigned identifier. All master identifiers of the non-volatile memory devices 122 in the same rank are either all selected or deselected. The assigned identifier is a unique identifier that is assigned to each of the non-volatile memory devices 122 in the rank. At the initial setup, the master identifiers of all eleven memory devices 122 are selected, and the read command mask bit is cleared for the first nine memory devices 122 (i.e., assigned identifier 1 to 9) but the read command mask bit is set for the tenth and eleventh memory devices. In other words, the data storage controller 102 may read data from the first nine memory devices, but the tenth and eleventh memory devices will block and not respond to a read command. In addition, the write command mask bit is cleared for the first ten memory devices (i.e., assigned identifier 1 to 10) but the write command mask bit is set for the eleventh memory device. In other words, the data storage controller 102 may write data to the first ten memory devices but the eleventh memory device will block and not respond to a write command.

In such examples, if the data storage controller 102 receives a read command (e.g., from the host 250) to read data from the tenth memory device 122, the device selector 212 is configured to clear the read command mask bit of the tenth memory device. This allows the data storage controller 102 to read data from the tenth memory device 122 as well as from the first nine memory devices 122 in response to receipt of the read command. Additionally, if the data storage controller 102 receives a write command to write data to the eleventh memory device 122, the device selector 212 is configured to clear the write command mask bit of the eleventh memory device 122. This allows the data storage controller 102 to write data to the eleventh memory device as well as from the first ten memory devices in response to receipt of the write command.

It should be appreciated that, in some embodiments, the command may be a read command, a write command, a refresh read command, and a refresh write command. In such embodiments, the refresh read command forces the non-volatile memory device 122 to perform a read command regardless of the status of the read command mask bit of the non-volatile memory device 122. Similarly, the refresh write command forces the non-volatile memory device 122 to perform a write command regardless of the status of the write command mask bit of the non-volatile memory device 122. Thus, the refresh commands have priority over other commands.

Additional Identifier

In some embodiments, the device selector 212 is configured to create a subgroup of one or more non-volatile memory devices 122 in a rank based on an additional identifier of each non-volatile memory device 122. In such embodiments, each non-volatile memory device 122 is assigned an additional identifier that is used to identify a non-volatile memory device 122 to add to or remove from a subgroup. For example, each non-volatile memory device 122 may include a master identifier for refresh or other commands, a first assigned identifier for read operations, and a second assigned identifier for write operations.

The command issuer 220, which may be embodied as hardware, firmware, software, virtualized hardware, emulated architecture, and/or a combination thereof as discussed above, is configured to manage the reading of data from and writing of data to a subgroup of non-volatile memory devices 122 of the non-volatile memory 118. To do so, the command issuer 220 includes a data reader 222, a data writer 224, and a refresher 226.

The data reader 222 is configured to read data from a selected subgroup of non-volatile memory device(s) 122 in response to a read command. To do so, the data reader 222 is configured to determine the subgroup of non-volatile memory devices 122 based on the received read command. As discussed above, the subgroup of non-volatile memory devices 122 includes one or more non-volatile memory devices 122 within the same rank. In some embodiments, the read command may identify one or more non-volatile memory devices 122 from which the data reader 222 is requested to read data. In some embodiments, the data reader 222 may select a subgroup of non-volatile memory device(s) 122 from the subgroup data 240 associated with parameters of the received read command, such as a context of the received read command, a type of data (e.g., text, image, video, audio) to be read, an amount of data to be read, and/or an identifier of software (e.g., a process, an application, etc.) associated with the read command. The subgroup data 240 includes a various subgroups of one or more non-volatile memory devices 122.

The data writer 224 is configured to write data to a selected subgroup of non-volatile memory device(s) 122 of a selected subgroup in response to a write command. To do so, the data writer 224 is configured to determine the subgroup of non-volatile memory devices 122 based on the received write command. As discussed above, the subgroup of non-volatile memory devices 122 includes one or more non-volatile memory devices 122 within the same rank. In some embodiments, the write command may identify one or more non-volatile memory devices 122 in which the data writer 224 is requested to write data. In some embodiments, the data writer 224 may select a subgroup of non-volatile memory device(s) 122 from the subgroup data 240 associated with parameters of the received write command, such as a context of the received write command, a type of data (e.g., text, image, video, audio) to be written, an amount of data to be written, and/or an identifier of software (e.g., a process, an application, etc.) associated with the write command.

The refresher 226 is configured to perform a requested command to all non-volatile memory devices 122 in a rank in response to a refresh command. For example, the refresh command may be a refresh read command. In such a case, the refresher 226 may force read data from all non-volatile memory devices 122 in a rank in response to a refresh read command regardless of the state of each non-volatile memory device 122 (e.g., a selected/deselected device state, a status of read command mask bit, selected identifier). Similarly, the refresh command may be a refresh write command. In such a case, the refresher 226 may force write data to all non-volatile memory devices 122 in a rank in response to a refresh write command regardless of the state of each non-volatile memory device 122 (e.g., a selected/deselected device state, a status of write command mask bit, selected identifier).

The interface manager 230 is configured to handle various instructions, including but not limited to, data storage instructions and data read instructions received from a host 250, which may be embodied as an application, service, and/or other device. In some embodiments, the interface manager 230 may be configured to handle other instructions as well, including self-monitoring, analysis and reporting technology ("SMART") instructions, and other instructions defined in the non-volatile memory express ("NVMe") specification. To handle the various instructions, the interface manager 230 is configured to identify a received instruction and any data and/or parameters associated with the instruction, and transmit those items to the data manager 210. For example, in response to a read instruction, the interface manager 230 transmits the data read by the data manager 210 to the host 250. Conversely, in response to a write instruction and/or a trim instruction, the interface manager 230 may transmit a result of the instruction to the host 250, for example a confirmation that the instruction was received and/or completed.

Figure 3:
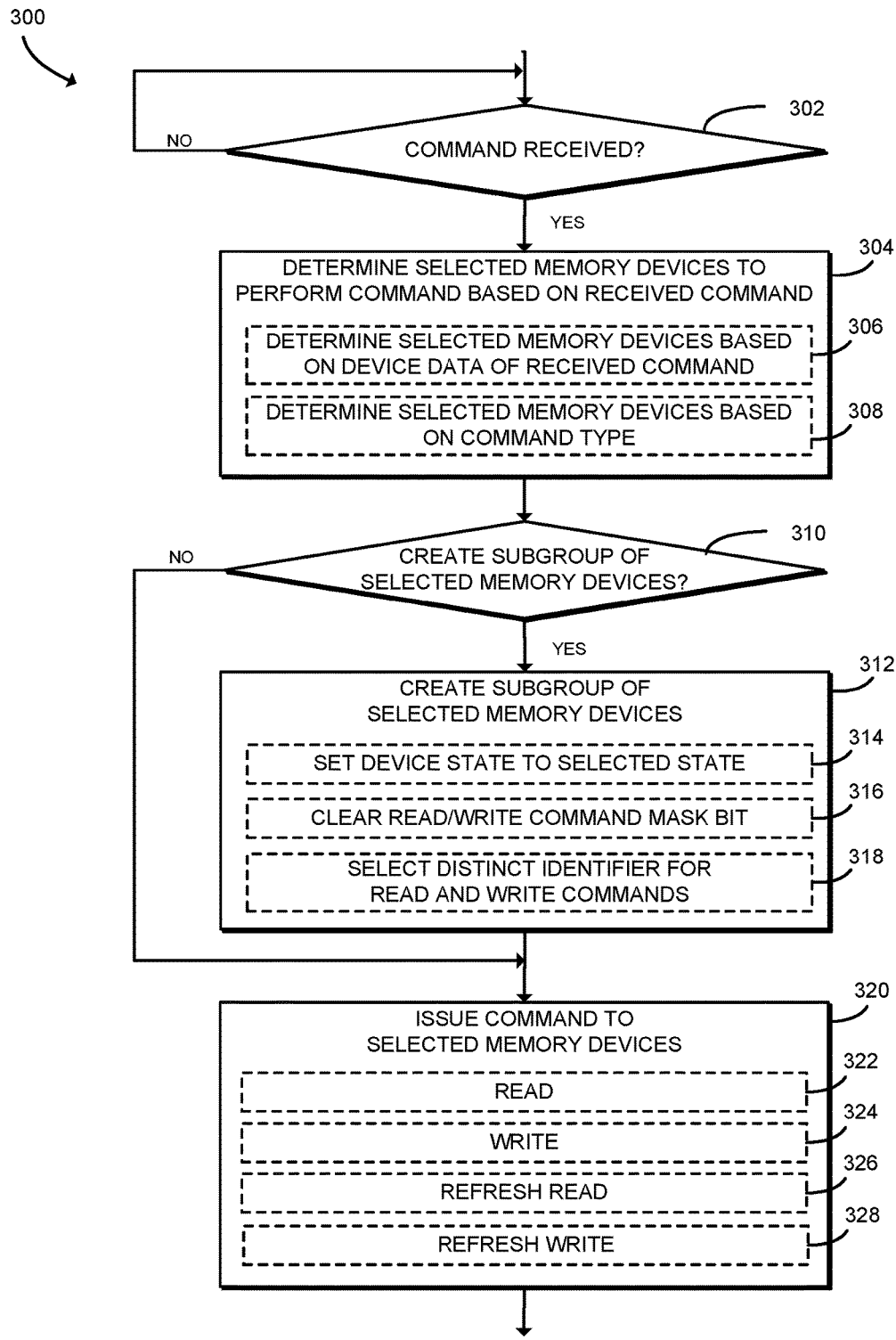
FIG. 3 is a simplified flow diagram of at least one embodiment of a method for selecting a subgroup that may be executed by the data storage controller of FIGS. 1 and 2.

Referring now to FIG. 3, in use, the data storage controller 102 of the data storage device 100 may execute a method 300 for performing a command on a subgroup of non-volatile memory devices 122. The method 300 begins at block 302 in which a data storage controller 102 determines whether a command has been received from a host 250 to perform the received command on one or more non-volatile memory devices 122 in a rank. As discussed above, in the illustrative embodiment, a command may be a read command, a write command, a refresh read command, or a refresh write command. If the data storage controller 102 determines that a command has not been received, the method 300 loops back to block 302 to continue waiting for a command from the host 250. If, however, the data storage controller 102 determines that a command has been received, the method 300 advances to block 304.

In block 304, the data storage controller 102 determines which non-volatile memory devices 122 are selected, based on the received command, to perform the received command operation. To do so, the data storage controller 102 may identify the received command and any device data associated with the received command in block 306. As discussed above, in some embodiments, the device data of each command may specify one or more non-volatile memory devices 122 within the rank to perform the command. Alternatively, in block 308, in other embodiments, the data storage controller 102 may determine one or more non-volatile memory devices 122 based on parameters of a command.

In block 310, the data storage controller 102 determines whether to create a subgroup of selected non-volatile memory devices 122 based on the received command. If the data storage controller 102 determines not to create a subgroup based on the received command, the method 300 skips ahead to block 320. For example, if the data storage controller 102 determines that the received command is requested to be applied to all non-volatile memory devices 122 in the rank, the data storage controller 102 determines that there is no need to create a subgroup. In some embodiments, the data storage controller 102 may select a subgroup from the subgroup data 240 based on parameters of the command and the selected non-volatile memory devices 122.

If, however, the data storage controller 102 determines to create a subgroup based on the selected non-volatile memory devices 122, the method 300 advances to block 312. In block 312, the data storage controller 102 creates a subgroup based on the selected non-volatile memory devices 122. To do so, in some embodiments, the data storage controller 102 may set a device state of each of the selected non-volatile memory devices 122 to a selected state in block 314. In some embodiments, the data storage controller 102 may clear a read or write command mask bit of each of the selected non-volatile memory devices 122 to zero in block 316. In other embodiments, the data storage controller 102 may create a subgroup of the selected non-volatile memory devices 122 by selecting an identifier of the non-volatile memory device 122 in block 318. For example, as discussed above, each non-volatile memory device 122 may include at least three distinct identifiers for read, write, and refresh or miscellaneous commands. The data storage controller 102 may create a subgroup of selected non-volatile memory devices 122 for a read command operation by identifying a read identifier of each of the selected non-volatile memory devices 122. It should be appreciated that the created subgroup may be stored in the subgroup data 240.

In block 320, the data storage controller 102 issues the received command to the selected non-volatile memory devices 122 to be performed. In block 322, if the issued command is a read command, the data storage controller 102 reads data from the selected subgroup of non-volatile memory devices 122. In block 324, if the issued command is a write command, the data storage controller 102 writes data to the selected subgroup of non-volatile memory devices 122. In block 326, if the issued command is a refresh read command, the data storage controller 102 reads data from the selected non-volatile memory devices 122 regardless of the status of the non-volatile memory device 122 (e.g., a selected/deselected device state, a status of read command mask bit, selected identifier). In block 328, if the issued command is a refresh write command, the data storage controller 102 writes data to the selected non-volatile memory devices 122 regardless of the status of the non-volatile memory device 122 (e.g., a selected/deselected device state, a status of write command mask bit, selected identifier). It should be appreciated that the selected non-volatile memory devices 122 may be a subgroup of non-volatile memory devices 122 in the rank or all non-volatile memory devices 122 in the rank depending on the received command. Further, it should be appreciated that while read, write and refresh commands are described as examples of commands that may be issued to the selected memory devices 122, in other embodiments, other commands may be issued to the selected memory devices 122.

Figure 4:
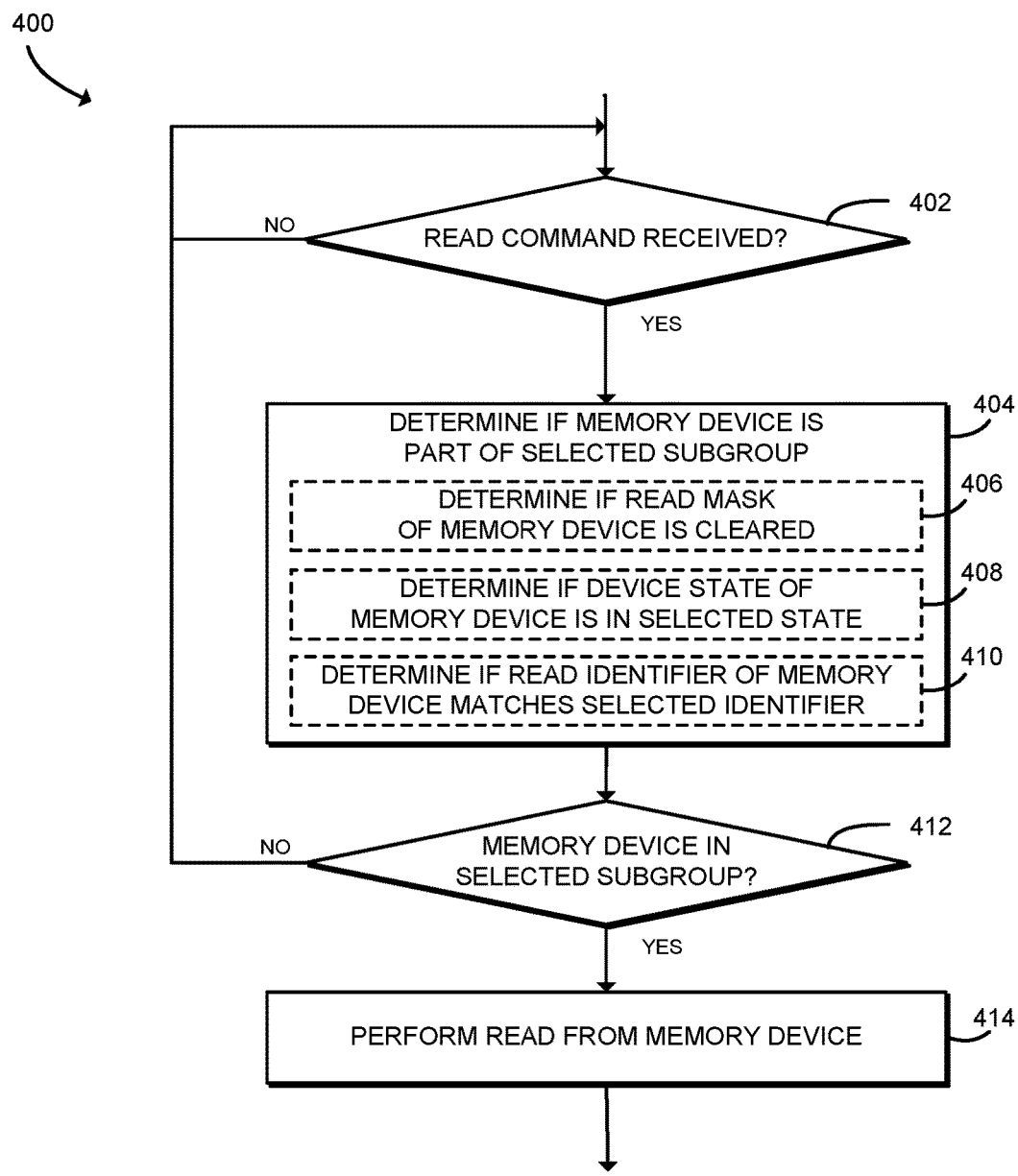
FIG. 4 is a simplified flow diagram of at least one embodiment of a method for reading data that may be executed by the data storage controller of FIGS. 1 and 2.

Referring now to FIG. 4, in use, the data reader 222 of the data storage controller 102 may execute a method 400 for reading data from the subgroup of selected non-volatile memory devices 122 in response to receipt of a read command. The method 400 begins at block 402 in which a data storage controller 102 determines whether a read command has been received from the host 250. If the data reader 222 determines that a read command has not been received, the method 400 loops back to block 402 to continue waiting for a read command. If, however, the data reader 222 determines that a read command has been received, the method 400 advances to block 404.

In block 404, the data reader 222 determines whether each non-volatile memory device 122 in the rank is part of a selected subgroup of non-volatile memory devices 122. To do so, in some embodiments, the data reader 222 may determine if a read command mask bit of the non-volatile memory device 122 is cleared (e.g., is equal to zero) in block 406. In such embodiment, if a non-volatile memory device 122 has a cleared read command mask bit, the data reader 222 determines that the non-volatile memory device 122 is part of the selected subgroup. In some embodiments, the data reader 222 may determine if a device state of the non-volatile memory device 122 is in a selected state in block 408. In such embodiments, if a non-volatile memory device 122 is in a selected state, the data reader 222 determines that the non-volatile memory device 122 is part of the selected subgroup. In other embodiments, the data reader 222 may determine if a read identifier of the non-volatile memory device 122 matches one of the selected identifiers indicated in the read command in block 410. In such embodiments, if a read identifier of a non-volatile memory device 122 matches one of the selected identifiers, the data reader 222 determines that the non-volatile memory device 122 is part of the selected subgroup.

If the data reader 222 determines that the non-volatile memory device 122 is part of the selected subgroup in block 412, the method 400 advances to block 414 to read data from the non-volatile memory device 122. If, however, the data reader 222 determines that the non-volatile memory device 122 is not part of the selected subgroup in block 412, the method 400 loops back to block 402 to continue waiting for another read command. It should be understood that, in the illustrative embodiment, the method 400 is performed concurrently for every memory device 122 in the rank.

Figure 5:
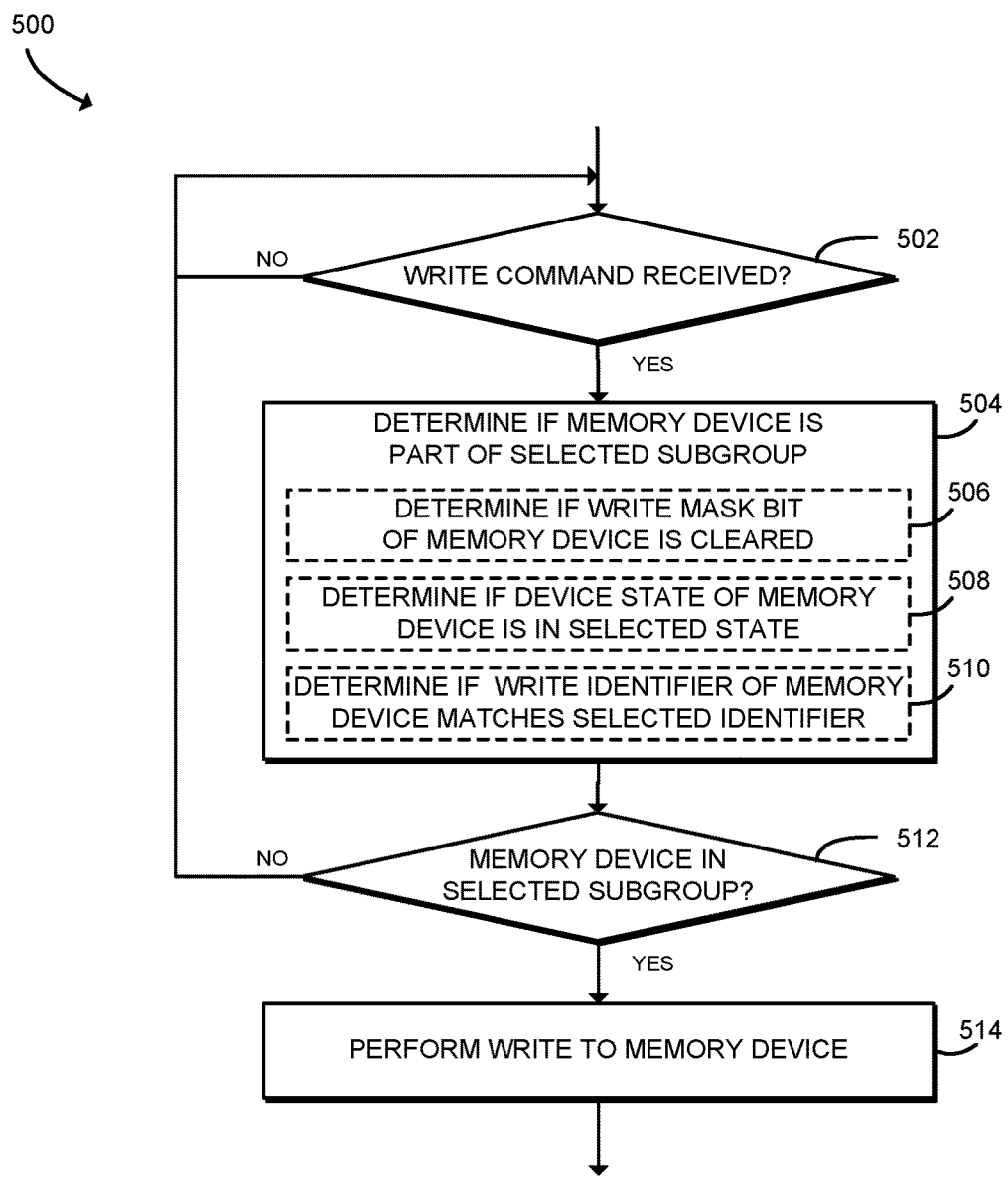
FIG. 5 is a simplified flow diagram of at least one embodiment of a method for writing data that may be executed by the data storage controller of FIGS. 1 and 2.

Referring now to FIG. 5, in use, the data writer 224 of data storage controller 102 may execute a method 500 for writing data to a subgroup of selected non-volatile memory devices 122 in response to receipt of a write command. The method 500 begins at block 502 in which a data storage controller 102 determines whether a write command has been received from a host 250. If the data writer 224 determines that a write command has not been received, the method 500 loops back to block 502 to continue waiting for a write command. If, however, the data writer 224 determines that a write command has been received, the method 500 advances to block 504.

In block 504, the data writer 224 determines whether each non-volatile memory device 122 in the rank is part of a selected subgroup of non-volatile memory devices 122. To do so, in some embodiments, the data writer 224 may determine if a write command mask bit of a given non-volatile memory device 122 is cleared (e.g., equal to zero) in block 506. In such embodiments, if a non-volatile memory device 122 has a cleared write command mask bit, the data writer 224 determines that the non-volatile memory device 122 is part of the selected subgroup. In some embodiments, the data writer 224 may determine if a device state of the non-volatile memory device 122 is in a selected state in block 508. In such embodiments, if a non-volatile memory device 122 is in a selected state, the data writer 224 determines that the non-volatile memory device 122 is part of the selected subgroup. In other embodiments, the data writer 224 may determine if a write identifier of the non-volatile memory device 122 matches one of the selected identifiers indicated in the write command in block 510. In such embodiments, if a write identifier of a non-volatile memory device 122 matches one of the selected identifiers, the data writer 224 determines that the non-volatile memory device 122 is part of the selected subgroup.

If the data writer 224 determines that the non-volatile memory device 122 is part of the selected subgroup in block 512, the method 500 advances to block 514 to write data to the non-volatile memory device 122. If, however, the data writer 224 determines that the non-volatile memory device 122 is not part of the selected subgroup in block 512, the method 500 loops back to block 502 to continue waiting for another write command. It should be understood that, in the illustrative embodiment, the method 500 is performed concurrently for every memory device 122 in the rank.

Figure 6:
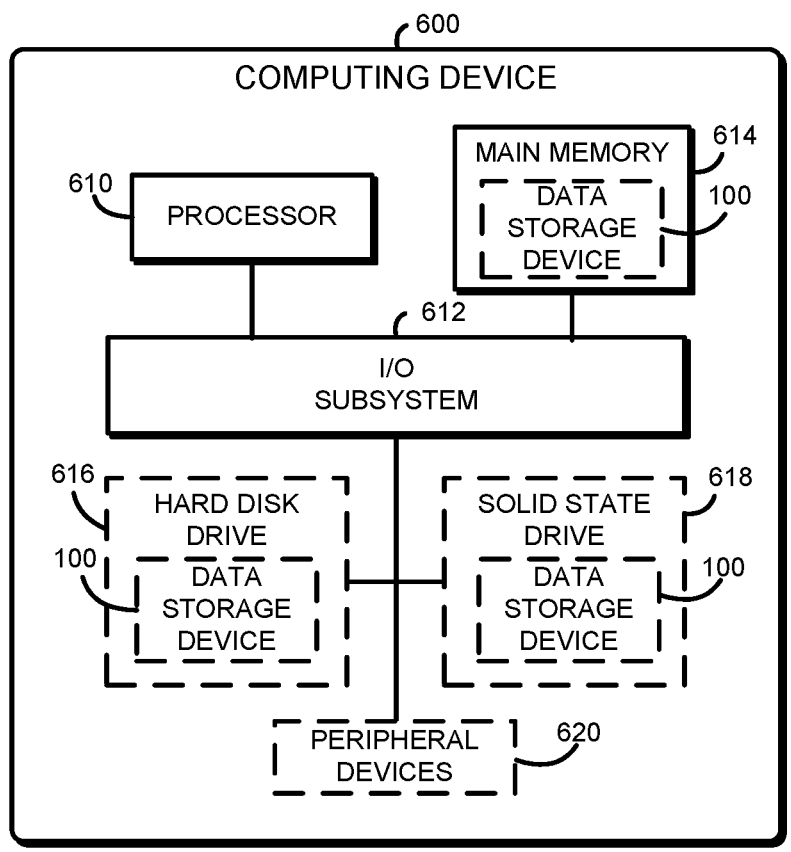
FIG. 6 is a simplified block diagram of at least one embodiment of a computing device including the data storage device of FIGS. 1 and 2.

Referring now to FIG. 6, in some embodiments, the data storage device 100 may be incorporated in, or form a portion of, a computing device 600. The computing device 600 may be embodied as any type of computing device in which the data storage device 100 may be used. For example, the computing device 600 may be embodied as a smart phone, a tablet computer, a notebook, a laptop computer, a netbook, an Ultrabook™, a wearable computing device, a pair of smart glasses, a head-mounted computing device, a cellular phone, a desktop computer, a smart device, a personal digital assistant, a mobile Internet device, a server, a data storage device, and/or any other computing/communication device. As shown in FIG. 6, the illustrative computing device 600 includes a processor 610, an input/output ("I/O") subsystem 612, and a main memory 614. It should be appreciated that, in some embodiments, the computing device 600 may include other or additional components, such as peripheral devices 620 or those commonly found in a typical computing device (e.g., various input/output devices and/or other components), in other embodiments. Additionally, in some embodiments, one or more of the illustrative components may be incorporated in, or otherwise form a portion of, another component. For example, the memory 614, or portions thereof, may be incorporated in the processor 610 in some embodiments.

The processor 610 may be embodied as any type of processor capable of performing the functions described herein. For example, the processor 610 may be embodied as a single or multi-core processor(s), digital signal processor, microcontroller, or other processor or processing/controlling circuit. Similarly, the memory 614 may be embodied as any type of volatile or non-volatile memory or data storage capable of performing the functions described herein. In operation, the memory 614 may store various data and software used during operation of the computing device 600 such as operating systems, applications, programs, libraries, and drivers. The memory 614 is communicatively coupled to the processor 610 via the I/O subsystem 612, which may be embodied as circuitry and/or components to facilitate input/output operations with the processor 610, the memory 614, and other components of the computing device 600. For example, the I/O subsystem 612 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

As shown in FIG. 6, the data storage device 100 may be incorporated in, or form a portion of, one or more other components of the computing device 600. For example, the data storage device 100 may be embodied as, or otherwise be included in, the main memory 614. Additionally or alternatively, the data storage device 100 may be embodied as, or otherwise included in, a solid state drive 618 of the computing device 600. Further, in some embodiments, the data storage device 100 may be embodied as, or otherwise included in, a hard disk drive 616 of the computing device 600. Of course, in other embodiments, the data storage device 100 may be included in or form a portion of other components of the computing device 600.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device.

EXAMPLES

Illustrative examples of the technologies disclosed herein are provided below. An embodiment of the technologies may include any one or more, and any combination of, the examples described below.

Example 1 includes an apparatus comprising a plurality of non-volatile, write in place, byte or block addressable memory devices, wherein the memory devices are arranged in one or more ranks, and the memory devices in each rank are connected to a same communication channel; and a data storage controller to select a subgroup of the plurality of the memory devices in a rank without modifying an identifier of each memory device, wherein the subgroup is more than one and less than all of the memory devices, and issue a command to operate on data of the selected subgroup.

Example 2 includes the subject matter of Example 1, and wherein to issue the command comprises to issue a read command to read data from the selected subgroup of the plurality of the memory devices in the rank.

Example 3 includes the subject matter of any of Examples 1 and 2, and wherein to issue the command comprises to issue a write command to write data to the selected subgroup of the plurality of the memory devices in the rank.

Example 4 includes the subject matter of any of Examples 1-3, and wherein to select the subgroup comprises to select a subgroup of nine of the memory devices; and to issue the command comprises to issue a read command.

Example 5 includes the subject matter of any of Examples 1-4, and wherein to select the subgroup comprises to select a subgroup of ten of the memory devices; and to issue the command comprises to issue a write command.

Example 6 includes the subject matter of any of Examples 1-5, and wherein the data storage controller is further to select all of the memory devices in the rank; and issue a refresh command of all of the memory devices in the rank.

Example 7 includes the subject matter of any of Examples 1-6, and wherein to issue the refresh command comprises to issue a refresh read command to read data from all of the memory devices in the rank.

Example 8 includes the subject matter of any of Examples 1-7, and wherein to issue the refresh command comprises to issue a refresh write command to write data to all of the memory devices in the rank.

Example 9 includes the subject matter of any of Examples 1-8, and wherein to select the subgroup of the plurality of the memory devices in the rank comprises to set a device state of one or more memory devices to a selected state.

Example 10 includes the subject matter of any of Examples 1-9, and wherein to select the subgroup of the plurality of the memory devices in the rank comprises to clear a read command mask bit of one or more memory devices in the rank.

Example 11 includes the subject matter of any of Examples 1-10, and wherein to select the subgroup of the plurality of the memory devices in the rank comprises to clear a write command mask bit of one or more memory devices in the rank.

Example 12 includes the subject matter of any of Examples 1-11, and wherein the data storage controller is further to set a read command mask bit of one or more memory devices in the rank to block a read command by one or more of the memory devices.

Example 13 includes the subject matter of any of Examples 1-12, and wherein the data storage controller is further to set a write command mask bit of one or more memory devices in the rank to block a write command by one or more of the memory devices.

Example 14 includes the subject matter of any of Examples 1-13, and wherein to select the subgroup comprises to select an initial memory device of the subgroup, by sending a selection of an identifier of the memory device to the memory devices; and issue at least one command to add an identifier of one or more memory devices to the subgroup.

Example 15 includes the subject matter of any of Examples 1-14, and wherein the data storage controller is further to issue a command to remove at least one memory device from the subgroup, wherein the command includes an identifier of one or more memory devices in the subgroup.

Example 16 includes the subject matter of any of Examples 1-15, and wherein the data storage controller is further to issue a second command to the subgroup after the one or more memory devices have been removed from the subgroup.

Example 17 includes the subject matter of any of Examples 1-16, and wherein each memory device is assigned two identifiers, and to select the subgroup comprises to assign an additional identifier to each memory device without a modification to one or more present identifiers of each memory device.

Example 18 includes a method comprising selecting, by a data storage controller, a subgroup of a plurality of memory devices in a rank without modifying an identifier of each memory device, wherein the plurality of the memory devices are non-volatile, write in place, byte or block addressable memory devices arranged in one or more ranks, the memory devices in each rank are connected to a same communication channel, and the subgroup is more than one and less than all of the memory devices; and issuing, by the data storage controller, a command to operate on data of the selected subgroup.

Example 19 includes the subject matter of Example 18, and wherein issuing the command comprises issuing, by the data storage controller, a read command to read data from the selected subgroup of the plurality of the memory devices in the rank.

Example 20 includes the subject matter of any of Examples 18 and 19, and wherein issuing a command comprises issuing, by the data storage controller, a write command to write data to the selected subgroup of the plurality of the memory devices in the rank.

Example 21 includes the subject matter of any of Examples 18-20, and wherein selecting the subgroup comprises selecting, by the data storage controller, a subgroup of nine of the memory devices; and issuing the command comprises issuing, by the data storage controller, a read command.

Example 22 includes the subject matter of any of Examples 18-21, and wherein selecting the subgroup comprises selecting, by the data storage controller, a subgroup of ten of the memory devices; and issuing the command comprises issuing, by the data storage controller, a write command.

Example 23 includes the subject matter of any of Examples 18-22, and further including selecting, by the data storage controller, all of the memory devices in the rank; and issuing, by the data storage controller, a refresh command of all of the memory devices in the rank.

Example 24 includes the subject matter of any of Examples 18-23, and wherein issuing the refresh command comprises issuing, by the data storage controller, a refresh read command to read data from all of the memory devices in the rank.

Example 25 includes the subject matter of any of Examples 18-24, and wherein issuing the refresh command comprises issuing, by the data storage controller, a refresh write command to write data to all of the memory devices in the rank.

Example 26 includes the subject matter of any of Examples 18-25, and wherein selecting the subgroup of the plurality of the memory devices in the rank comprises setting, by the data storage controller, a device state of one or more memory devices to a selected state.

Example 27 includes the subject matter of any of Examples 18-26, and wherein selecting the subgroup of the plurality of the memory devices in the rank comprises clearing, by the data storage controller, a read command mask bit of one or more memory devices in the rank.

Example 28 includes the subject matter of any of Examples 18-27, and wherein selecting the subgroup of the plurality of the memory devices in the rank comprises clearing, by the data storage controller, a write command mask bit of one or more memory devices in the rank.

Example 29 includes the subject matter of any of Examples 18-28, and further including setting, by the data storage controller, a read command mask bit of one or more memory devices in the rank to block a read command by one or more of the memory devices.

Example 30 includes the subject matter of any of Examples 18-29, and further including setting, by the data storage controller, a write command mask bit of one or more memory devices in the rank to block a write command by one or more of the memory devices.

Example 31 includes the subject matter of any of Examples 18-30, and wherein selecting the subgroup comprises selecting, by the data storage controller, an initial memory device of the subgroup, by sending a selection of an identifier of the memory device to the memory devices; and issuing, by the data storage controller, at least one command to add an identifier of one or more of the memory devices to the subgroup.

Example 32 includes the subject matter of any of Examples 18-31, and further including issuing, by the data storage controller, a command to remove at least one memory device from the subgroup, wherein the command includes an identifier of one or more memory devices in the subgroup.

Example 33 includes the subject matter of any of Examples 18-32, and further including issuing, by the data storage controller, a second command to the subgroup after the one or more memory devices have been removed from the subgroup.

Example 34 includes the subject matter of any of Examples 18-33, and wherein each memory device is assigned two identifiers, and selecting the subgroup comprises assigning, by the data storage controller, an additional identifier to each memory device without a modification to one or more present identifiers of each memory device.

Example 35 includes one or more machine-readable storage media comprising a plurality of instructions stored thereon that, when executed, cause an apparatus to perform the method of any of Examples 18-34.

Example 36 includes an apparatus comprising means for selecting a subgroup of a plurality of memory devices in a rank without modifying an identifier of each memory device, wherein the plurality of the memory devices are non-volatile, write in place, byte or block addressable memory devices arranged in one or more ranks, the memory devices in each rank are connected to a same communication channel, and the subgroup is more than one and less than all of the memory devices; and means for issuing a command to operate on data of the selected subgroup.

Example 37 includes the subject matter of Example 36, and wherein the means for issuing the command comprises means for issuing a read command to read data from the selected subgroup of the plurality of the memory devices in the rank.

Example 38 includes the subject matter of any of Examples 36 and 37, and wherein the means for issuing a command comprises means for issuing a write command to write data to the selected subgroup of the plurality of the memory devices in the rank.

Example 39 includes the subject matter of any of Examples 36-38, and wherein the means for selecting the subgroup comprises means for selecting a subgroup of nine of the memory devices; and the means for issuing the command comprises means for issuing a read command.

Example 40 includes the subject matter of any of Examples 36-39, and wherein the means for selecting the subgroup comprises means for selecting a subgroup of ten of the memory devices; and the means for issuing the command comprises means for issuing a write command.

Example 41 includes the subject matter of any of Examples 36-40, and further including means for selecting all of the memory devices in the rank; and means for issuing a refresh command of all of the memory devices in the rank.

Example 42 includes the subject matter of any of Examples 36-41, and wherein the means for issuing the refresh command comprises means for issuing a refresh read command to read data from all of the memory devices in the rank.

Example 43 includes the subject matter of any of Examples 36-42, and wherein the means for issuing the refresh command comprises means for issuing a refresh write command to write data to all of the memory devices in the rank.

Example 44 includes the subject matter of any of Examples 36-43, and wherein the means for selecting the subgroup of the plurality of the memory devices in the rank comprises means for setting a device state of one or more memory devices to a selected state.

Example 45 includes the subject matter of any of Examples 36-44, and wherein the means for selecting the subgroup of the plurality of the memory devices in the rank comprises means for clearing a read command mask bit of one or more memory devices in the rank.

Example 46 includes the subject matter of any of Examples 36-45, and wherein the means for selecting the subgroup of the plurality of the memory devices in the rank comprises means for clearing a write command mask bit of one or more memory devices in the rank.

Example 47 includes the subject matter of any of Examples 36-46, and further including means for setting a read command mask bit of one or more memory devices in the rank to block a read command by one or more of the memory devices.

Example 48 includes the subject matter of any of Examples 36-47, and further including means for setting a write command mask bit of one or more memory devices in the rank to block a write command by one or more of the memory devices.

Example 49 includes the subject matter of any of Examples 36-48, and wherein the means for selecting the subgroup comprises means for selecting an initial memory device of the subgroup, by sending a selection of an identifier of the memory device to the memory devices; and means for issuing at least one command to add an identifier of one or more of the memory devices to the subgroup.

Example 50 includes the subject matter of any of Examples 36-49, and further including means for issuing a command to remove at least one memory device from the subgroup, wherein the command includes an identifier of one or more memory devices in the subgroup.

Example 51 includes the subject matter of any of Examples 36-50, and further including means for issuing a second command to the subgroup after the one or more memory devices have been removed from the subgroup.

Example 52 includes the subject matter of any of Examples 36-51, and wherein each memory device is assigned two identifiers, and the means for selecting the subgroup comprises means for assigning an additional identifier to each memory device without a modification to one or more present identifiers of each memory device.

The invention claimed is:

1. An apparatus comprising:
a data storage controller to:
select a subgroup of a plurality of memory devices in a rank without modifying an identifier of each memory device, wherein the plurality of the memory devices are non-volatile, write in place, byte or block addressable memory devices arranged in one or more ranks, the memory devices in each rank are connected to a same communication channel, the subgroup is more than one and less than all of the memory devices in the rank, and selecting the subgroup includes modifying a value of at least one of two mode register mask bits included in each of the memory devices, and issue a command to operate on data of the selected subgroup.

2. The apparatus of claim 1, wherein to issue the command comprises to issue a read command to read data from the selected subgroup of the plurality of the memory devices in the rank.

3. The apparatus of claim 1, wherein to issue the command comprises to issue a write command to write data to the selected subgroup of the plurality of the memory devices in the rank.

4. The apparatus of claim 1, wherein:
to select the subgroup comprises to select a subgroup of nine of the memory devices; and
to issue the command comprises to issue a read command.

5. The apparatus of claim 1, wherein:
to select the subgroup comprises to select a subgroup of ten of the memory devices; and
to issue the command comprises to issue a write command.

6. The apparatus of claim 1, wherein the data storage controller is further to:
select all of the memory devices in the rank; and
issue a refresh command of all of the memory devices in the rank.

7. The apparatus of claim 6, wherein to issue the refresh command comprises to issue a refresh read command to read data from all of the memory devices in the rank.

8. The apparatus of claim 6, wherein to issue the refresh command comprises to issue a refresh write command to write data to all of the memory devices in the rank.

9. The apparatus of claim 1, wherein to select the subgroup of the plurality of the memory devices in the rank comprises to set a device state of one or more memory devices to a selected state.

10. The apparatus of claim 1, wherein to select the subgroup of the plurality of the memory devices in the rank comprises to clear a read command mask bit of one or more memory devices in the rank.

11. The apparatus of claim 1, wherein to select the subgroup of the plurality of the memory devices in the rank comprises to clear a write command mask bit of one or more memory devices in the rank.

12. One or more non-transitory machine-readable storage media comprising a plurality of instructions stored thereon that, when executed by a data storage controller, cause the data storage controller to:
select a subgroup of a plurality of memory devices in a rank without modifying an identifier of each memory device, wherein the plurality of the memory devices are non-volatile, write in place, byte or block addressable memory devices arranged in one or more ranks, the memory devices in each rank are connected to a same communication channel, the subgroup is more than one and less than all of the memory devices in the rank, and selecting the subgroup includes modifying a value of at least one of two mode register mask bits included in each of the memory devices; and
issue a command to operate on data of the selected subgroup.

13. The one or more non-transitory machine-readable storage media of claim 12, wherein to issue the command comprises to issue a read command to read data from the selected subgroup of the plurality of the memory devices in the rank.

14. The one or more non-transitory machine-readable storage media of claim 12, wherein to issue the command comprises to issue a write command to write data to the selected subgroup of the plurality of the memory devices in the rank.

15. The one or more non-transitory machine-readable storage media of claim 12, wherein:
to select the subgroup comprises to select a subgroup of nine of the memory devices; and
to issue the command comprises to issue a read command.

16. The one or more non-transitory machine-readable storage media of claim 12, wherein:
to select the subgroup comprises to select a subgroup of ten of the memory devices; and
to issue the command comprises to issue a write command.

17. The one or more non-transitory machine-readable storage media of claim 12, wherein the plurality of instructions, when executed, further cause the data storage controller to:
select all of the memory devices in the rank; and
issue a refresh command of all of the memory devices in the rank.

18. The one or more non-transitory machine-readable storage media of claim 17, wherein to issue the refresh command comprises to issue a refresh read command to read data from all of the memory devices in the rank.

19. The one or more non-transitory machine-readable storage media of claim 17, wherein to issue the refresh command comprises to issue a refresh write command to write data to all of the memory devices in the rank.

20. The one or more non-transitory machine-readable storage media of claim 12, wherein to select the subgroup of the plurality of the memory devices in the rank comprises to set a device state of one or more memory devices to a selected state.

21. The one or more non-transitory machine-readable storage media of claim 12, wherein to select the subgroup of the plurality of the memory devices in the rank comprises to clear a read command mask bit of one or more memory devices in the rank.

22. A method comprising:
selecting, by a data storage controller, a subgroup of a plurality of memory devices in a rank without modifying an identifier of each memory device, wherein the plurality of the memory devices are non-volatile, write in place, byte or block addressable memory devices arranged in one or more ranks, the memory devices in each rank are connected to a same communication channel, the subgroup is more than one and less than all of the memory devices in the rank, and selecting the subgroup includes modifying a value of at least one of two mode register mask bits included in each of the memory devices; and
issuing, by the data storage controller, a command to operate on data of the selected subgroup.

23. The method of claim 22, wherein issuing the command comprises issuing, by the data storage controller, a read command to read data from the selected subgroup of the plurality of the memory devices in the rank.

24. The method of claim 22, wherein issuing a command comprises issuing, by the data storage controller, a write command to write data to the selected subgroup of the plurality of the memory devices in the rank.

25. The method of claim 22, wherein:
selecting the subgroup comprises selecting, by the data storage controller, a subgroup of nine of the memory devices; and
issuing the command comprises issuing, by the data storage controller, a read command.

\* \* \* \* \*